United States Patent [19]
Balkin et al.

[11] Patent Number: 5,835,504
[45] Date of Patent: Nov. 10, 1998

[54] SOFT FUSES USING BIST FOR CACHE SELF TEST

[75] Inventors: David K. Balkin, Essex Junction; Robert M. Houle, Willston; Kenneth Torino, Colchester; Sebastian T. Ventrone, South Burlington, all of Vt.

[73] Assignee: International Business Machines Corporation, Armonk, N.Y.

[21] Appl. No.: 839,276

[22] Filed: Apr. 17, 1997

[51] Int. Cl.$^6$ .................................................. G06F 11/00
[52] U.S. Cl. .............................................. 371/21.6
[58] Field of Search ................................ 371/21.6, 21.4, 371/21.2, 25.1, 27.1; 395/182.03, 182.06, 183.06

[56] References Cited

U.S. PATENT DOCUMENTS

| | | |
|---|---|---|
| 4,357,656 | 11/1982 | Saltz et al. . |
| 5,070,502 | 12/1991 | Supnik . |
| 5,204,836 | 4/1993 | Reed . |
| 5,537,665 | 7/1996 | Patel et al. . |
| 5,548,713 | 8/1996 | Petry et al. ............................. 395/183 |
| 5,551,004 | 8/1996 | McClure . |
| 5,596,716 | 1/1997 | Byers et al. ............................. 395/185 |

OTHER PUBLICATIONS

T. Jaber, et al., "Using Partially Good Data Cache VLSI Chips in an Environment of Flexible System Configuration", IBM Technical Bulletin, vol. 32, No. 12, May 1990, pp. 139–141.

"Built–In–Self–Test of Arrays Embedded in Logic Chips", IBM Technical Disclosure Bulletin, vol. 33, No. 1B, Jun. 1990, pp. 306–309.

*Primary Examiner*—Vincent P. Canney
*Attorney, Agent, or Firm*—Whitham, Curtis & Whitham; Eugene Schkurko

[57] ABSTRACT

A method of cache testing and fault correction is implemented subsequent to wafer dicing. Cache testing is moved from wafer level to the built-in self test (BIST) at machine level. The BIST is utilized along with cache redundancy for fault correction. The processor initiates a cache line test using BIST upon power-up. When the processor is powered up and the test mode pins are set for the array test, the array BIST test begins. The BIST traverses the array and tests each word line for hardware faults. Upon detection of a fault, the current address is stored in one of N fault address registers contained in the processor. These fault address registers are used to address redundant cache lines and therefore act as "soft" fuses. The entire cache structure is traversed in this manner with the addresses of any line faults being stored. If the number of found faults, indicated by stored addresses, are less than the number of redundant fault lines, then the processor self test will proceed to the next test. However, if the number of faults exceed the maximum number N of redundant fault registers, then an error condition will be broadcast to either a set of pins or registers, and the cache will not be allowed to be enabled.

12 Claims, 3 Drawing Sheets

SOFT FUSES USING BIST FOR CACHE SELF TEST

BACKGROUND OF THE INVENTION

1. Field of the Invention

The present invention generally relates to cache memories (or caches) implemented in very large scale integrated (VLSI) circuits and, more particularly, to testing and fault correction of cache arrays.

2. Background Description

With larger caches, significant yield impacts can occur due to bad word lines within caches. Often, greater than fifty per cent of the die is made up of memory cells. Any hard or soft failures within the memory cells can render the part non-functional and, therefore, scrap. One method of reducing scrap has been to add redundant cache lines and use an array test to isolate bad word lines. Once the bad word line is isolated, a replacement line is created by blowing a set of fuses for that particular word line. Then, when the part is functioning and the cache is indexed with the original address, the redundant line is used instead of the bad line.

Unfortunately, the array test and fuse blowing can only be performed at wafer test; that is, before the wafer is diced into individual chips. This added test adds expense and complexity that may be unacceptable for some production hardware. In addition, if the part deteriorates in the field, any future failures cannot be detected and corrected, since the test will never be performed again. Due to these problems, an alternative approach to array cache testing is needed.

SUMMARY OF THE INVENTION

It is therefore an object of the present invention to provide a method of cache testing and fault correction which can be implemented subsequent to wafer dicing.

According to the invention, cache testing is moved from wafer level to the built-in self test (BIST) at machine level. The BIST is utilized along with cache redundancy for fault correction. The processor initiates a cache line test using BIST upon power-up. When the processor is powered up and the test mode pins are set for the array test, the array BIST test begins. The BIST traverses the array and tests each word line for hardware faults. Upon detection of a fault, the current address is stored in one of N fault address registers contained in the processor. These fault address registers are used to address redundant cache lines and therefore act as "soft" fuses. The entire cache structure is traversed in this manner with the addresses of any line faults being stored. If the number of found faults, indicated by stored addresses, are less than the number of redundant fault lines, then the processor self test will proceed to the next test. However, if the number of faults exceed the maximum number N of redundant fault registers, then an error condition will be broadcast to either a set of pins or registers, and the cache will not be allowed to be enabled.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
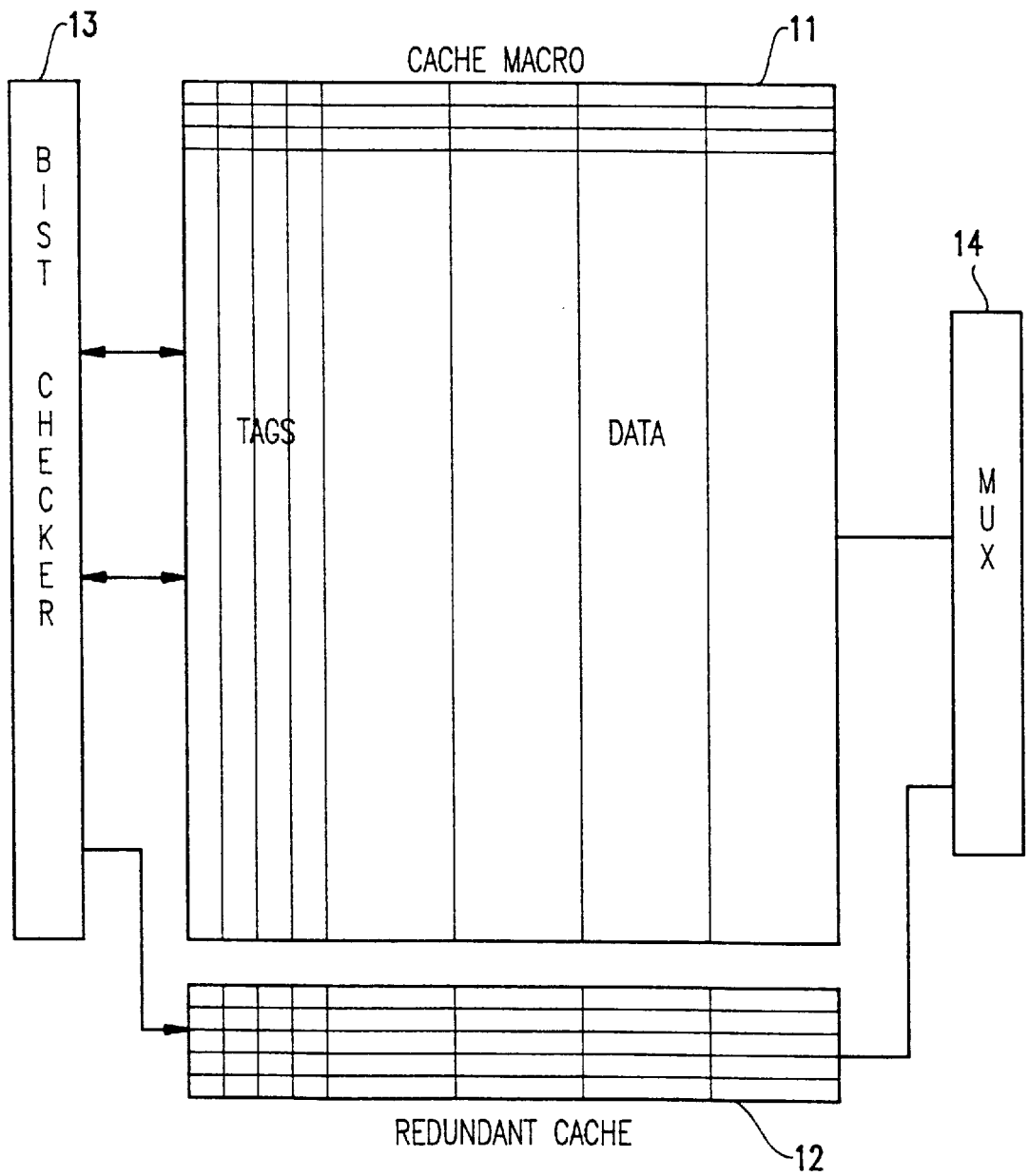
FIG. 1 is a block diagram showing the general architecture of a cache macro with redundant cache and BIST checker.

Referring now to the drawings, and more particularly to FIG. 1, there is shown a cache macro 11 which stores both data and tags. A redundant cache 12 is used to replace defective lines in the cache 11. The built-in self test (BIST) checker 13, which is part of a processor (not shown), scans the lines in cache 11 to detect any defective lines. The addresses of the defective lines are stored in registers in the processor, and when a stored address matches on a cache hit, a redundant line from the redundant cache 12 is substituted. The outputs of the cache 11 and the redundant cache 12 are combined in multiplexer 14.

In operation, once the cache 11 is enabled, the processor will access the cache by providing an address index. In parallel to the cache access, the address index is checked against one of N stored redundant address registers to determine whether or not the line is a previously identified bad word line. If the line is not a match to the stored redundant address, then the data is provided by the main cache structure 11 via multiplexer 14. If a match exists, then the data is provided by the redundant line in the redundant cache 12, also via multiplexer 14. If the operation is a write, then the cache line will be updated along with the redundant location if there is an address match.

Built into the redundant registers 12 is the same tag structure and least recently used (LRU) algorithm as that in the cache structure 11. With this feature, the processor BIST mechanism determines the bad cache lines, and through registers and redundant tag/word lines replaces any bad lines detected at every power up of the system.

With this invention, no longer will valuable wafer test time, and expensive fuse blow equipment be required. In addition, if a hard failure manifests itself after final chip test, the failure can still be detected and corrected at the system level to yield functioning hardware.

Figure 2:
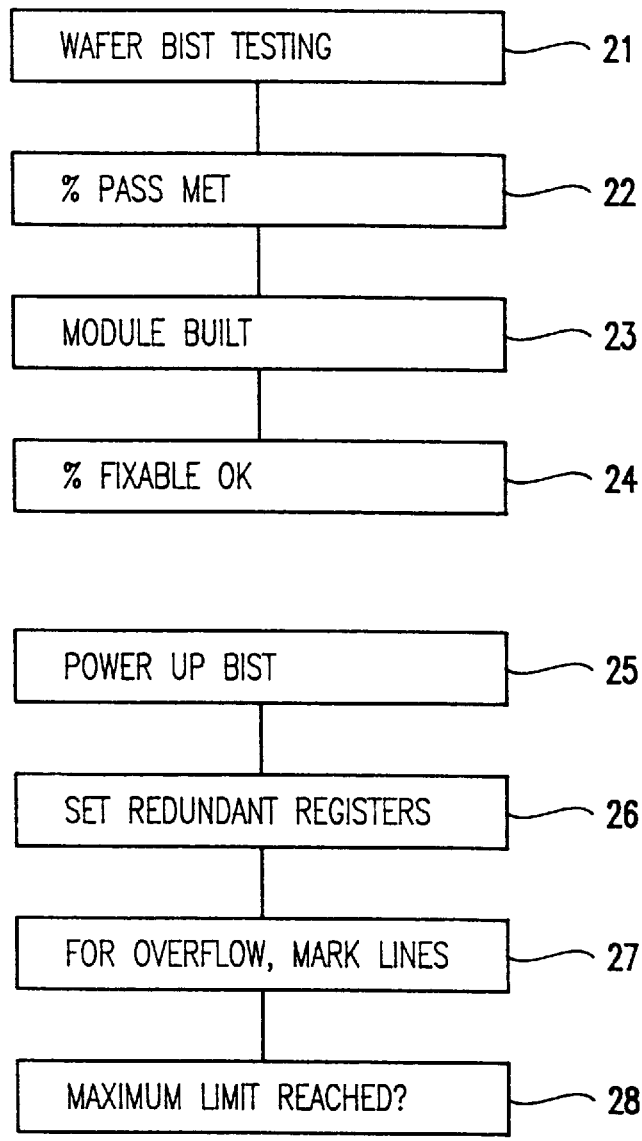
FIG. 2 is a flow diagram showing the cache line checking process implemented by the invention.

The invention may be implemented in a comprehensive array test program including wafer level testing as shown in FIG. 2. Cache arrays are tested at wafer level in function block 21. The wafers that pass are processed through final metalization in function block 22. The wafer is then diced to produce individual chips. The chips are used to build modules in function block 23. The built modules are tested, and those that are fixable by blowing fuses, are fixed in function block 24. The process to this point is conventional. The invention goes beyond this conventional process by implementing the array test in the built-in self test (BIST) of the processor.

At power-up, the processor initiates built-in self test (BIST) in function block 25. This BIST, however, implements the array test described above. As part of the test, redundant registers in the processor are set in function block 26. These registers are loaded with the addresses of cache lines detected as faulty during BIST. These registers act as soft fuses effectively substituting a redundant cache line for a detected faulty cache line. This test is performed at every power-up so that random or hard failures that occur in the field are detected and fixed with this soft fuse technique.

Using this technique of BIST, a further enhancement can be made if the number of failures exceed N redundant register locations. Once the N number of redundant locations have been filled with bad line locations, the cache error status would have to be declared to the system.

Subsequently, as indicated in function block 27, the bad cache portion up to the word line width divided by the architectural word width, along with the number of bits are devoted to line marking. In the maximum case, each architectural word width could be marked with a functional bit depending upon the results of the BIST, as indicated in function block 28. If the N locations have been previously allocated to other bad lines, then the BIST program would mark the additional failures with a non-functional value.

Alternatively to adding bits to the cache to mark bad word lines, a small register file could be used to store the word line addresses of the bad word lines in excess of the ones that can be fixed by redundancy alone. The TAG and cache line replacement logic would query this small register file to ensure those bad cache lines were not used.

Once the processor cache is enabled, the non-functional locations will reduce the total number of cache locations within the processor. Since most caches have multiple associativity (4-way, 8-way, etc.), then potentially, one of the "ways" for a single set of cache lines could not be included in the base set due to the non-functionality discovered during BIST. Due to the large number of cache lines, and the small number of bad word lines (beyond the already fixed lines that use redundant address locations) the overall impact to the system performance would be minimal. If greater than X locations beyond the maximum word lines was reached of bad locations, the BIST could notify the system via pins or registers that the cache was bad, and would prevent any enabling of the cache.

Given the fact that on-chip caches are increasing in size rapidly, it may be more cost effective not to have any word line redundancy, but only this small table or bad word line addresses. In this way, all chips are not penalize with a 3 to 5% cache area increase for redundancy at the expense of minimally affecting overall system performance.

Another enhancement to the BIST power-up array test with redundant registers would be to incorporate additional guard band during the test. The intent of the guard band would be to attempt to capture any cache lines that may be cycle time dependent. A particular cache line may pass the test upon the initial BIST testing. As the hardware heats up, the cache unit begins to slow down. If the failure mechanism only shows up at the slower speed, then a fail escape could exist even after the BIST test Consequently, one approach would be to guard band the BIST test with frequency margin.

Figure 3:
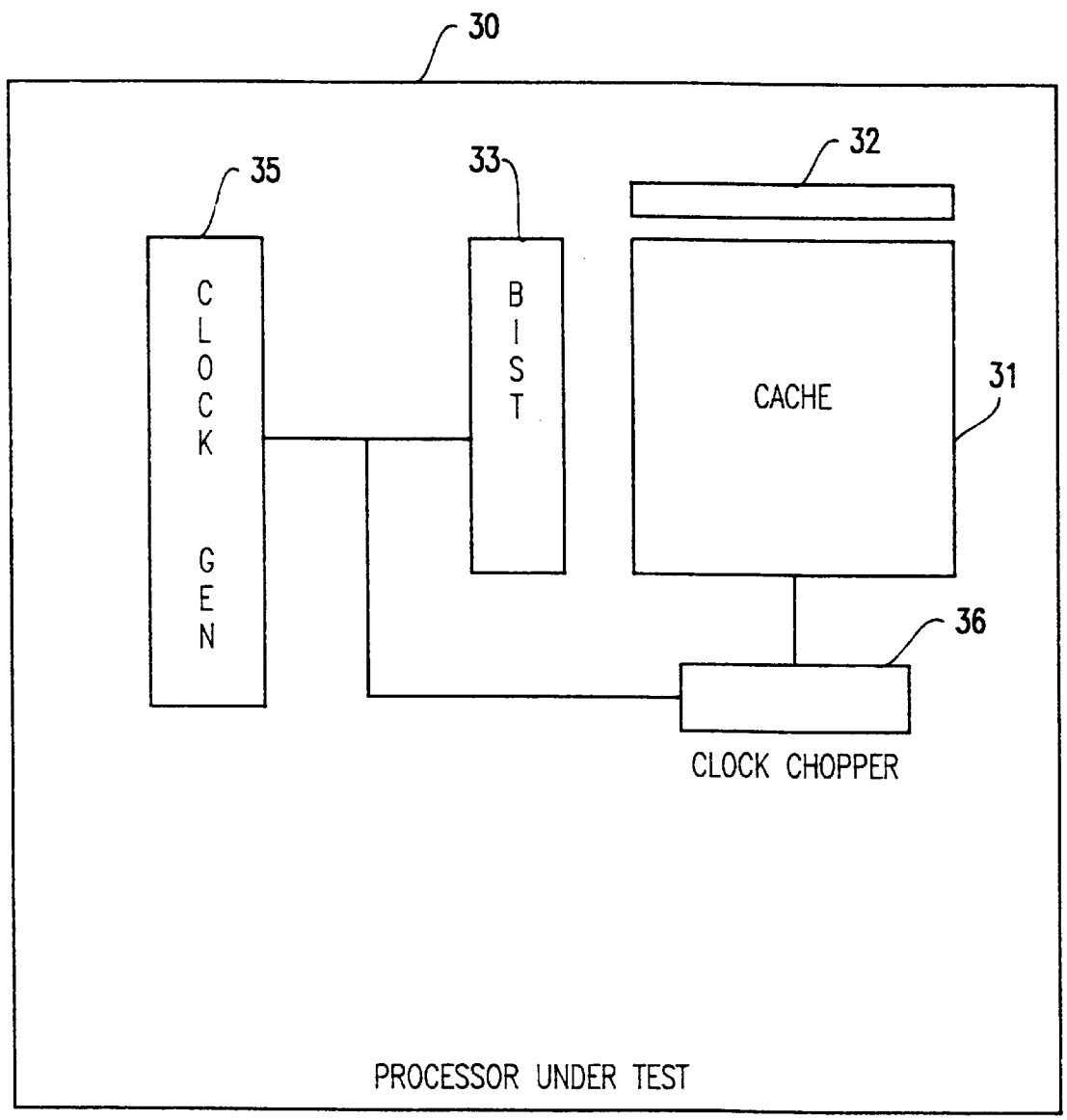
FIG. 3 is a block diagram showing a processor with guard band hardware for BIST for cache array testing.

The hardware for guard banding is shown in FIG. 3. The processor 30 includes a cache array 31, redundant cache 32 and BIST 33, substantially as shown in FIG. 1. A clock generator 35 generates clock signals to the BIST 33 and supplies clock pulses to a clock chopper 36 that drives the cache array 31. During the BIST portion of the cache testing, the cache 31 is stressed by giving it a shorter cycle time. Since the required increase in frequency does not need to be very much to compensate for a temperature increase, a clock chopper 36 is used to clock a small delay to the read clock and write clock when a cache access is initiated, thereby reducing the amount or time the cache 31 has to output its data to the rest of the chip whose clocks have not been altered. The amount of delay required to give the appropriate guard band is determined by circuit simulation. The cache recovery mechanism works the same as that described earlier.

The second guard band approach is to run the BIST cache test at a lower operating voltage than the standard operating condition. The effect of the lower voltage would be the same if the part were slowing down due to a higher operating temperature. Once again, the BIST testing would occur for the cache, and upon completion, the voltage would be returned to the normal operating range.

A third approach for guard banding the soft fuse BIST would be to control via an I/O port the external cooling, and thus allow the part to ramp up to the required high temperature functional range. Using an onboard thermocouple, the BIST test would be run at the desired temperature range. Due to the thermal mass of the chip, this test could be completed within a thermal ramp window. The BIST would mark the bad location, and immediately re-start the cooling fan via a second I/O write.

Any or all combinations of the above guard band techniques would further enhance the ability of the BIST technique to find cache line faults.

An additional advantage of using the this method is the reduction of wafer test time. At wafer test, the BIST test can test up to a predefined ratio of good sites versus bad sites. If the ratio is less then the maximum ratio, then the wafer test can stop the cache testing resulting in dramatic reduction of test time. The ability of shortening the wafer test time is a unique result of the soft fuse ability. At module test, the entire cache test would be run to ensure at product ship the cache was 100% fixable.

While the invention has been described in terms of a preferred embodiment, those skilled in the art will recognize that the invention can be practiced with modification within the spirit and scope of the appended claims.

Having thus described our invention, what we claim as new and desire to secure by letters patent is as follows:

1. A method of array cache testing implemented in a built-in self test of a processor, the cache including cache redundancy for fault correction, the method comprising the steps of:

initiating cache line testing as part of the built-in self test upon processor power-up;

traversing the array and testing each word line for hardware faults;

upon detection of a fault, storing a current address in one of N fault address registers contained in the processor; and using the fault address registers to address redundant cache lines during subsequent operation of the processor.

2. The method of array cache testing recited in claim 1 further comprising the steps of:

comparing a number of detected faults to N; and if the number of detected faults exceeds N, issuing a cache fault indication.

3. The method of array cache testing recited in claim 2 wherein if the number of detected faults exceeds N, further comprising the step of inhibiting the cache array from being enabled.

4. The method of array cache testing recited in claim 2 further comprising the step of marking bad word lines in excess of N.

5. The method of array cache testing recited in claim 4 further comprising the steps of:

storing addresses of marked bad word lines in a register; and querying the register prior to accessing the cache to insure that bad word lines are not used.

6. The method of array cache testing recited in claim 1 wherein the cache has multiple associativity, further comprising the step of inhibiting one of the multiple associativity ways of the cache to exclude non-functional word lines in excess of N.

7. The method of array cache testing recited in claim 1 wherein the cache line testing of the built-in self test includes the step of guard banding the cache array by testing at a different frequency.

8. A processor including an array cache including cache redundancy for fault correction, the processor comprising:

testing means for initiating cache line testing as part of a built-in self test upon processor power-up, said cache line testing traversing the array and testing each word line for hardware faults;

detecting means responsive to the testing means for detecting a fault and storing a current address in one of N fault address registers contained in the processor; and cache accessing means for using the fault address registers to address redundant cache lines during subsequent operation of the processor.

9. The processor recited in claim 8 further comprising comparing means responsive to the detecting means for comparing a number of detected faults to N and, if the number of detected faults exceeds N, issuing a cache fault indication.

10. The processor recited in claim 9 further comprising a register, the comparing means marking bad word lines in excess of N in the register, and the cache accessing means querying the register prior to accessing the cache to insure that bad word lines are not used.

11. The processor recited in claim 8 wherein the cache has multiple associativity, further comprising means for inhibiting one of the multiple associativity ways of the cache to exclude non-functional word lines in excess of N.

12. The processor recited in claim 8 wherein the testing means includes a variable frequency clock generator for guard banding the cache array by testing at a different frequency.

* * * * *

UNITED STATES PATENT AND TRADEMARK OFFICE
CERTIFICATE OF CORRECTION

PATENT NO. : 5,835,504
DATED : November 10, 1998
INVENTOR(S) : David K. Balkin et al.

It is certified that error appears in the above-identified patent and that said Letters Patent is hereby corrected as shown below:

On the title page, Item [56] under Attorney, Agent, or Firm, please change "Schkurko" to --Shkurko--.

Signed and Sealed this

Thirteenth Day of July, 1999

Attest:

Q. TODD DICKINSON

*Attesting Officer*   *Acting Commissioner of Patents and Trademarks*